(12) United States Patent
Kwack et al.

(10) Patent No.: US 7,228,370 B2
(45) Date of Patent: Jun. 5, 2007

(54) DATA OUTPUT DEVICE AND METHOD OF SEMICONDUCTOR DEVICE

(75) Inventors: Seung Kwack, Daejeon-Si (KR); Ki Kwean, Icheon-Shi (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 125 days.

(21) Appl. No.: 11/162,168

(22) Filed: Aug. 31, 2005

(65) Prior Publication Data

US 2007/0008008 A1    Jan. 11, 2007

(30) Foreign Application Priority Data

Jul. 6, 2005   (KR) .................... 10-2005-0060596

(51) Int. Cl.
*G06F 3/00* (2006.01)
*H03K 19/0175* (2006.01)

(52) U.S. Cl. .................... 710/52; 710/58; 710/309; 326/86

(58) Field of Classification Search ............... 710/52, 710/58, 33, 309
See application file for complete search history.

(56) References Cited

U.S. PATENT DOCUMENTS

| | | | |
|---|---|---|---|
| 5,784,110 A * | 7/1998 | Acampora et al. | 375/240.23 |
| 6,112,268 A * | 8/2000 | Ohashi et al. | 710/52 |
| 2001/0007115 A1 | 7/2001 | Yim et al. | |
| 2005/0002223 A1 | 1/2005 | Coteus et al. | |
| 2007/0011481 A1* | 1/2007 | Kwack et al. | 713/330 |

FOREIGN PATENT DOCUMENTS

JP    6289154    10/1994

OTHER PUBLICATIONS

Kwack et al., "A Pre-DBI(PDBI) method for Giga Hz DRAM's", The 12th Korean Conference on Semiconductors, COEX Conference Center, http://kcs.cosar.or.kr, Feb. 24-25, 2005, pp. 12, 395-396.

* cited by examiner

*Primary Examiner*—Vibol Tan
(74) *Attorney, Agent, or Firm*—Marshall, Gerstein & Borun LLP (57) ABSTRACT

A data output device is disclosed having a first comparator for comparing first output data with arbitrary output data on a bit-by-bit basis and outputting a first pre-flag signal, a second comparator for comparing second output data with the first output data on a bit-by-bit basis and outputting a second pre-flag signal, first and second logic units for performing logic operations with respect to pre-flag signals and data inversion flag signals, a first output unit for inverting or non-inverting and outputting a plurality of bits contained in the first output data in response to the first data inversion flag signal, a second output unit for inverting or non-inverting and outputting a plurality of bits contained in the second output data in response to the second data inversion flag signal, and an output data initializer for, when a no-operation period is generated in a series of data output operations, initializing the arbitrary output data and supplying the resulting data to the first comparator.

33 Claims, 8 Drawing Sheets

DATA OUTPUT DEVICE AND METHOD OF SEMICONDUCTOR DEVICE

CROSS REFERENCE TO RELATED APPLICATIONS

This application relies for priority upon Korean Patent Application No. 2005-60596 filed on Jul. 6, 2005, the contents of which are herein incorporated by reference in their entirety.

FIELD OF THE INVENTION

The present invention relates to a data output device and method of a semiconductor device, and more particularly to a data output device and method of a semiconductor device which can reduce power noise in an output driver resulting from a data transition when data is outputted from the semiconductor device and can accurately and stably process high-speed data even though a no-operation period is generated in a series of data output operations.

DESCRIPTION OF THE RELATED ART

With the continuous advance of a semiconductor memory device, a variety of new operating systems have recently been proposed to process data at high speed. The semiconductor memory device is adapted to perform a write/read operation based on the operation of an input/output stage. That is, the memory device transfers internal data externally, or receives external data internally and stores it in a memory. This data read or write operation is carried out through a DQ pin.

Under a conventional low-frequency operating environment, the high-speed operation of the memory device is of little importance. However, recently, as the demand for the high-speed operation of a processor such as a central processing unit (CPU) or graphics processing unit (GPU) increases rapidly, the low-power/high-speed operation of the memory device has been increasingly required. Meanwhile, for accurate and stable transfer of data, an adequate bandwidth must be ensured. However, because of power noise and switching noise resulting from a switching operation with respect to data, it is not easy to acquire an adequate bandwidth for data transferred to an input/output stage. In this regard, it has also become a very important issue to enable a high-speed input/output operation along with the high-frequency operation.

Figure 1:
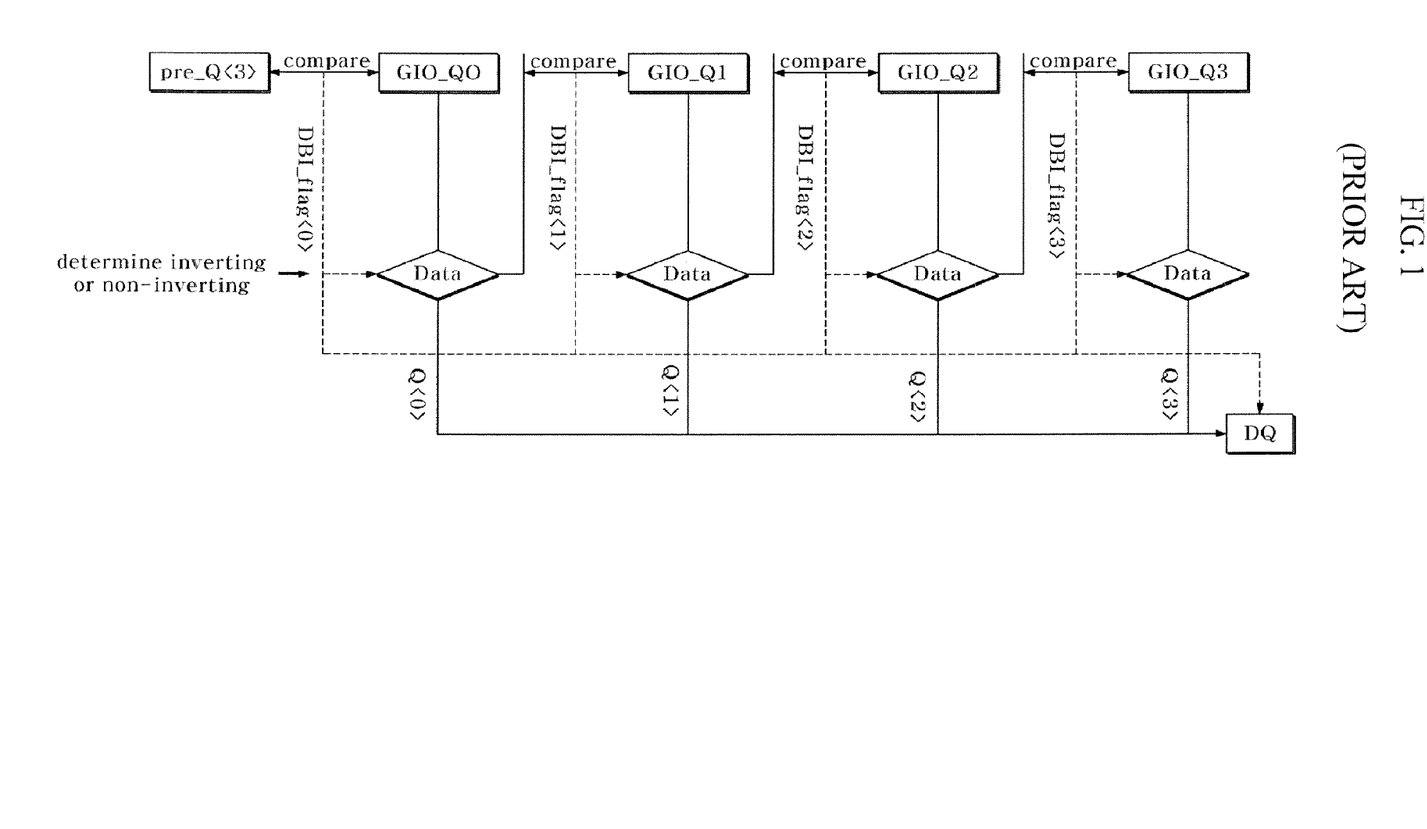
FIG. 1 is a schematic view illustrating a conventional data output method of a semiconductor device.
Figure 2:
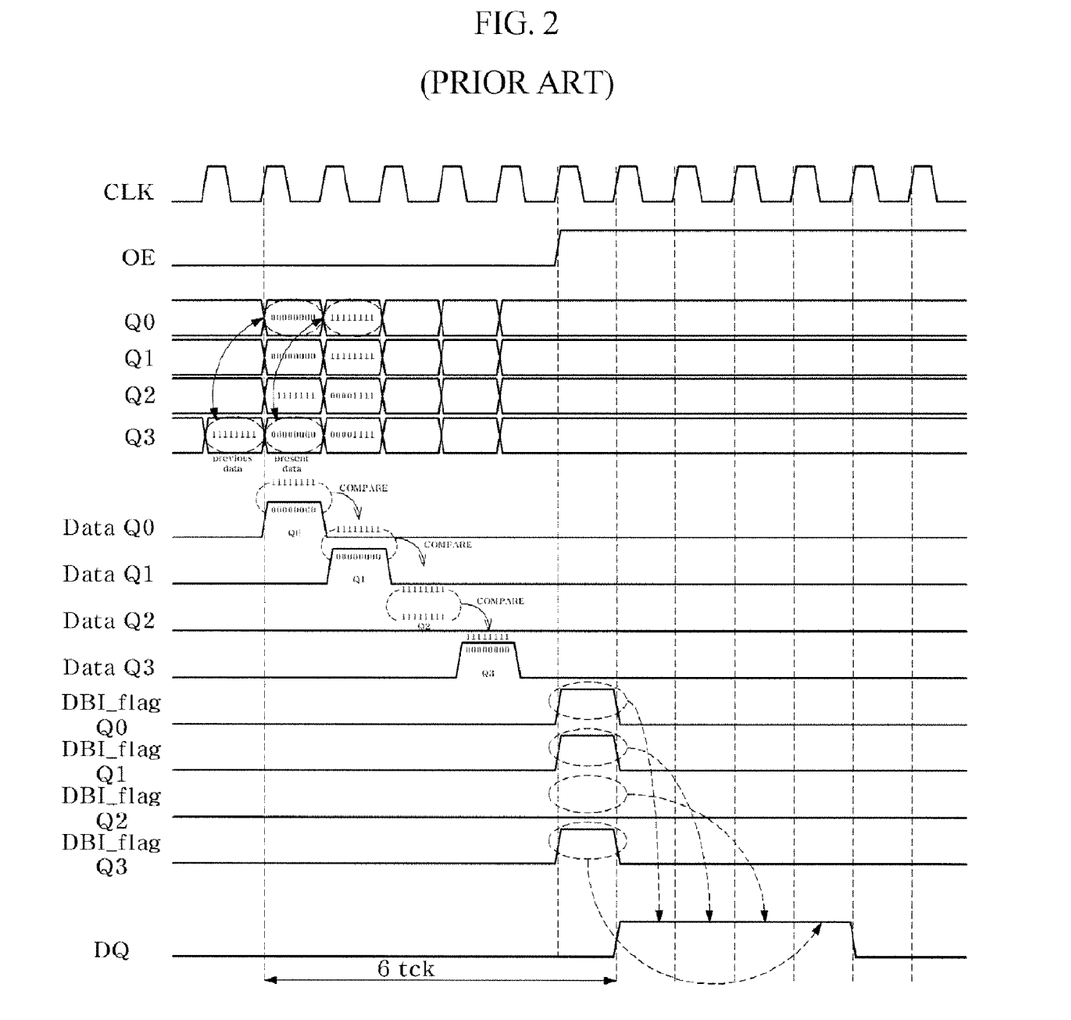
FIG. 2 is a timing diagram of signals in the conventional data output method.

Data bit inversion (DBI) has been proposed as one data processing method to solve the above problem. This DBI is characterized by reduction of power noise occurring in operation of an output driver by reducing the number of transitions of data which is outputted to the output driver. FIG. 1 is a schematic view illustrating a conventional data output method based on the DBI, and FIG. 2 is a timing diagram of signals in the conventional data output method.

In the conventional DBI-based data output method, previously generated data is latched and then compared with currently generated data on a bit-by-bit basis. A determination is made according to the comparison as to how many bits of the currently generated data have made high to low level transitions or low to high level transitions. If the number of bits of the currently generated data having made the level transitions is determined to exceed half the total number of bits of the currently generated data, each bit of the currently generated data is inverted and outputted. On the contrary, in the case where the number of bits of the currently generated data having made the level transitions does not exceed half the total number of bits of the currently generated data, each bit of the currently generated data is outputted directly, and not inverted.

In more detail, as shown in FIG. 1, if four output data are sent over global output lines, first, data GIO_Q0, among the four output data, is compared with data pre_Q<3> generated at the previous step on a bit-by-bit basis. A high-level data inversion flag signal DBI_flag<0> is outputted if the number of bits of the data GIO_Q0 having made level transitions exceeds half the total number of bits of the data GIO_Q0, and a low-level data inversion flag signal DBI_flag<0> is outputted otherwise. Then, the data GIO_Q0 is inverted or non-inverted and outputted as data Q<0> according to the level of the data inversion flag signal DBI_flag<0>.

Next, data GIO_Q1 is compared with the inverted or non-inverted data Q<0> on a bit-by-bit basis, and a data inversion flag signal DBI_flag<1> of a high level or low level is then outputted according to the number of bits of the data GIO_Q1 having made level transitions. Then, the data GIO_Q1 is inverted or non-inverted and outputted as data Q<1> according to the level of the data inversion flag signal DBI_flag<1>. This operation is continuously repeated in the conventional DBI-based data output method.

However, the above-mentioned conventional DBI-based data output method is disadvantageous in that a sufficient address access time margin cannot be secured and high-speed data cannot be accurately and stably processed in a high-frequency operation. That is, as can be seen from the above description, in the conventional DBI-based data output method, the sequential comparison of the current data with the previous data involves four sequential comparison operations per output step, for example, in a 4-bit pre-fetch mode and eight sequential comparison operations per output step, for example, in an 8-bit pre-fetch mode. For this reason, only when at least a period of 5 clk to 8 clk must be guaranteed, is the data output enabled (see FIG. 2), thereby making it difficult to secure an adequate data access time margin and consuming a relatively large amount of time in processing data. In conclusion, the conventional DBI-based data output method has the disadvantage of not only being hard to apply and implement for the high-frequency operation, but also being inappropriate to the accurate and stable processing of high-speed data.

SUMMARY OF THE INVENTION

Therefore, the present invention has been made in view of the above problems, and it is an object of the present invention to provide a data output device and method of a semiconductor device which can reduce power noise in an output driver resulting from a data transition when data is outputted from the semiconductor device, can accurately and stably process high-speed data in a high-frequency operation of the semiconductor device, and can normally output data even though a no-operation period is generated in a series of data output operations.

In accordance with an aspect of the present invention, the above and other objects can be accomplished by the provision of a data output device of a semiconductor device, comprising: a first comparator for comparing first output data with arbitrary output data latched at a previous data processing step on a bit-by-bit basis and outputting a first pre-flag signal which is enabled or disabled according to the number of bits of the first output data having made level transitions; a second comparator for comparing second output data with the first output data on a bit-by-bit basis and outputting a second pre-flag signal which is enabled or disabled according to the number of bits of the second output data having made level transitions; a first logic unit for performing a logic operation with respect to the first pre-flag signal and an arbitrary data inversion flag signal latched at the previous data processing step and outputting a first data inversion flag signal; a second logic unit for performing a logic operation with respect to the second pre-flag signal and the first data inversion flag signal and outputting a second data inversion flag signal; a first output unit for inverting or non-inverting and outputting a plurality of bits contained in the first output data in response to the first data inversion flag signal; a second output unit for inverting or non-inverting and outputting a plurality of bits contained in the second output data in response to the second data inversion flag signal; and an output data initializer for, when a no-operation period is generated in a series of data output operations, initializing the arbitrary output data and supplying the resulting data to the first comparator.

Preferably, the output data initializer includes: transfer means for transferring the arbitrary output data to a first node; and a driver for driving and initializing the first node to a predetermined level in response to an initialization signal which is enabled for a predetermined period when the no-operation period is generated.

The driver may include pull-up means for pulling the first node up in response to the initialization signal.

The output data initializer may further include latch means for latching an output signal from the first node.

Preferably, the data output device further comprises an initialization signal generator for generating the initialization signal, the initialization signal generator including: a first buffer for buffering a first control signal which is enabled for a predetermined period upon input of a read command; first logic means for performing a logic operation with respect to an output signal from the first buffer and a second control signal which is enabled for a burst operation period; a second buffer including pull-up means for pulling a second node up in response to an output signal from the first logic means and the first control signal, and pull-down means for pulling the second node down in response to the first control signal; second logic means for performing a logic operation with respect to the output signal from the first logic means and an output signal from the second buffer; third logic means for performing a logic operation with respect to the first control signal and the output signal from the first logic means; a latch circuit including a first logic element and a second logic element interconnected in latch form, the first logic element receiving an output signal from the third logic means at one input terminal thereof, the second logic element receiving an output signal from the second logic means at one input terminal thereof; and fourth logic means for performing a logic operation with respect to the first control signal and an output signal from the latch circuit.

The first buffer may be an inversion-delay buffer.

Each of the first to third logic means may perform a NAND operation.

Each of the first and second logic elements may perform a NAND operation.

The fourth logic means may perform a logical sum operation.

Preferably, the data output device further comprises a flag initializer for, when the no-operation period is generated, initializing the arbitrary data inversion flag signal and supplying the resulting signal to the first logic unit.

Preferably, the flag initializer includes: a driver for driving and initializing a first node, to which the arbitrary data inversion flag signal has been transferred, to a predetermined level in response to an initialization signal which is enabled for a predetermined period when the no-operation period is generated; and latch means for latching an output signal from the first node.

The driver may include pull-down means for pulling the first node down in response to the initialization signal.

Preferably, the data output device further comprises an initialization signal generator for generating the initialization signal, the initialization signal generator including: a first buffer for buffering a first control signal which is enabled for a predetermined period upon input of a read command; first logic means for performing a logic operation with respect to an output signal from the first buffer and a second control signal which is enabled for a burst operation period; a second buffer including pull-up means for pulling a second node up in response to an output signal from the first logic means and the first control signal, and pull-down means for pulling the second node down in response to the first control signal; second logic means for performing a logic operation with respect to the output signal from the first logic means and an output signal from the second buffer; third logic means for performing a logic operation with respect to the first control signal and the output signal from the first logic means; a latch circuit including a first logic element and a second logic element interconnected in latch form, the first logic element receiving an output signal from the third logic means at one input terminal thereof, the second logic element receiving an output signal from the second logic means at one input terminal thereof; and fourth logic means for performing a logic operation with respect to the first control signal and an output signal from the latch circuit.

The first buffer may be an inversion-delay buffer.

Each of the first to third logic means may perform a NAND operation.

Each of the first and second logic elements may perform a NAND operation.

The fourth logic means may perform a logical sum operation.

Preferably, the first and second comparators perform their comparison operations at the same time.

Each of the first and second comparators may enable a corresponding one of the first and second pre-flag signals if the number of the bits of an associated one of the first and second output data having made the level transitions exceeds half of a total number of the bits of the associated output data.

Each of the first and second comparators may compare two output data with each other on a bit-by-bit basis to output the corresponding pre-flag signal. In this case, the two output data are the first output data and arbitrary output data, or the first output data and second output data, and each of the first and second comparators includes: a plurality of logic elements, each of the logic elements performing a logic operation with respect to two associated bits of the same order contained respectively in the two output data; a plurality of signal supply circuits, each of the signal supply circuits performing a logic operation with respect to a strobe signal and an output signal from an associated one of the logic elements and supplying the resulting signals to a first node and a second node, respectively; a first differential amplifier for comparison-amplifying an output signal from the first node and an output signal from the second node; a second differential amplifier for comparison-amplifying the output signal from the first node and the output signal from the second node; and a main amplifier for comparison-amplifying an output signal from the first differential amplifier and an output signal from the second differential amplifier and outputting the resulting signal as the corresponding pre-flag signal.

Each of the logic elements may perform an exclusive-OR operation.

Preferably, each of the signal supply circuits includes: first logic means for performing a logical product operation with respect to the strobe signal and the output signal from the associated logic element and supplying the resulting signal to the first node; and second logic means for performing a NOR operation with respect to an inverted signal of the strobe signal and the output signal from the associated logic element and supplying the resulting signal to the second node.

Each of the first and second logic units may perform an exclusive-OR operation.

Each of the first and second output data may be sent over an associated global output line.

The arbitrary output data latched at the previous data processing step may be last output data at the previous data processing step.

The arbitrary data inversion flag signal latched at the previous data processing step may be a last data inversion flag signal at the previous data processing step.

In accordance with another aspect of the present invention, there is provided a data output method of a semiconductor device, comprising the steps of: (a) comparing first output data with arbitrary output data latched at a previous data processing step on a bit-by-bit basis and outputting a first pre-flag signal which is enabled or disabled according to the number of bits of the first output data having made level transitions, and simultaneously comparing second output data with the first output data on a bit-by-bit basis and outputting a second pre-flag signal which is enabled or disabled according to the number of bits of the second output data having made level transitions; (b) performing a logic operation with respect to the first pre-flag signal and an arbitrary data inversion flag signal latched at the previous data processing step and outputting a first data inversion flag signal, and performing a logic operation with respect to the second pre-flag signal and the first data inversion flag signal and outputting a second data inversion flag signal; and (c) inverting or non-inverting and outputting a plurality of bits contained in the first or second output data in response to the first or second data inversion flag signal, wherein the step (a) includes the step of, when a no-operation period is generated in a series of data output operations, initializing the arbitrary output data and comparing the first output data with the resulting data.

Preferably, the step (b) includes the step of, when the no-operation period is generated, initializing the arbitrary data inversion flag signal and performing a logic operation with respect to the first pre-flag signal and the resulting signal.

Preferably, the step (a) further includes the step of enabling the first or second pre-flag signal if the number of the bits of the first or second output data having made the level transitions exceeds half of a total number of the bits of the first or second output data.

Each of the logic operations at the step (b) may be an exclusive-OR operation.

Each of the first and second output data may be sent over an associated global output line.

The arbitrary output data latched at the previous data processing step may be last output data at the previous data processing step.

The arbitrary data inversion flag signal latched at the previous data processing step may be a last data inversion flag signal at the previous data processing step.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 3:
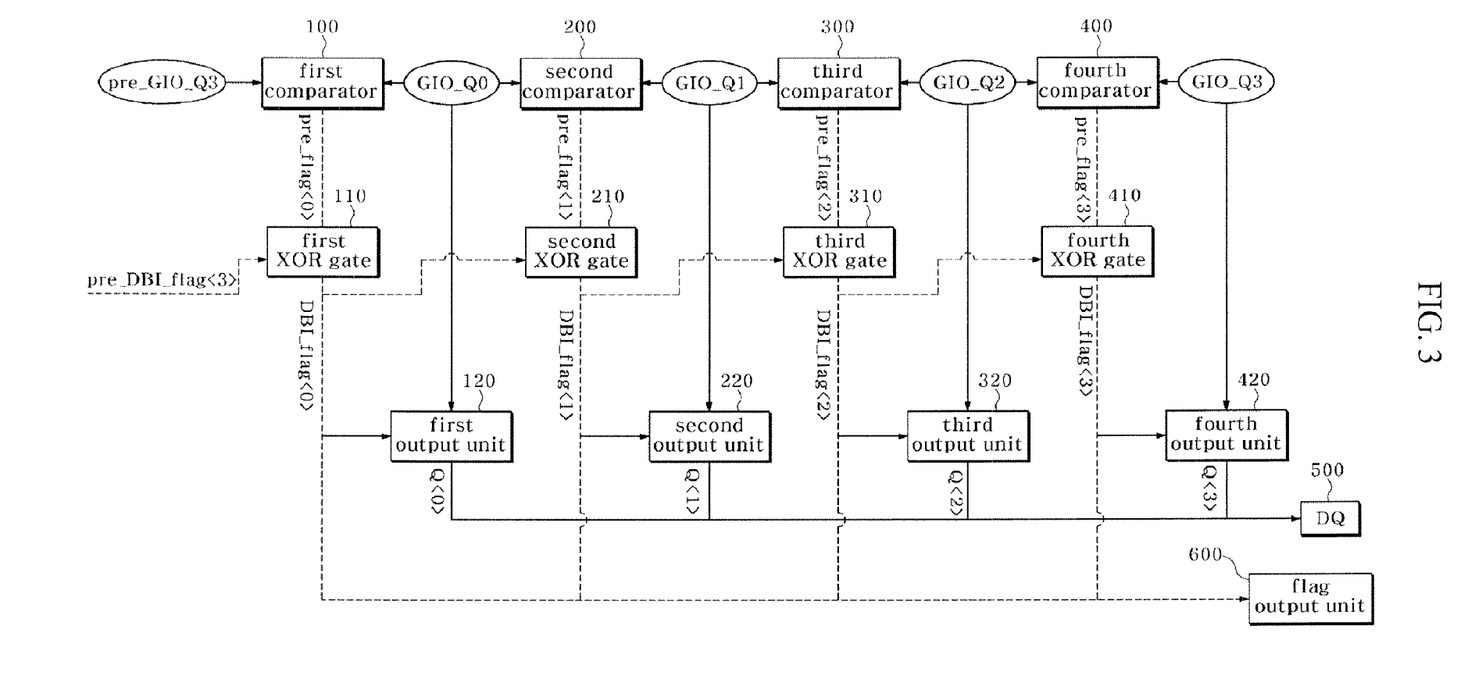
FIG. 3 is a schematic block diagram showing the configuration of a data output device of a semiconductor device according to the present invention.
Figure 4:
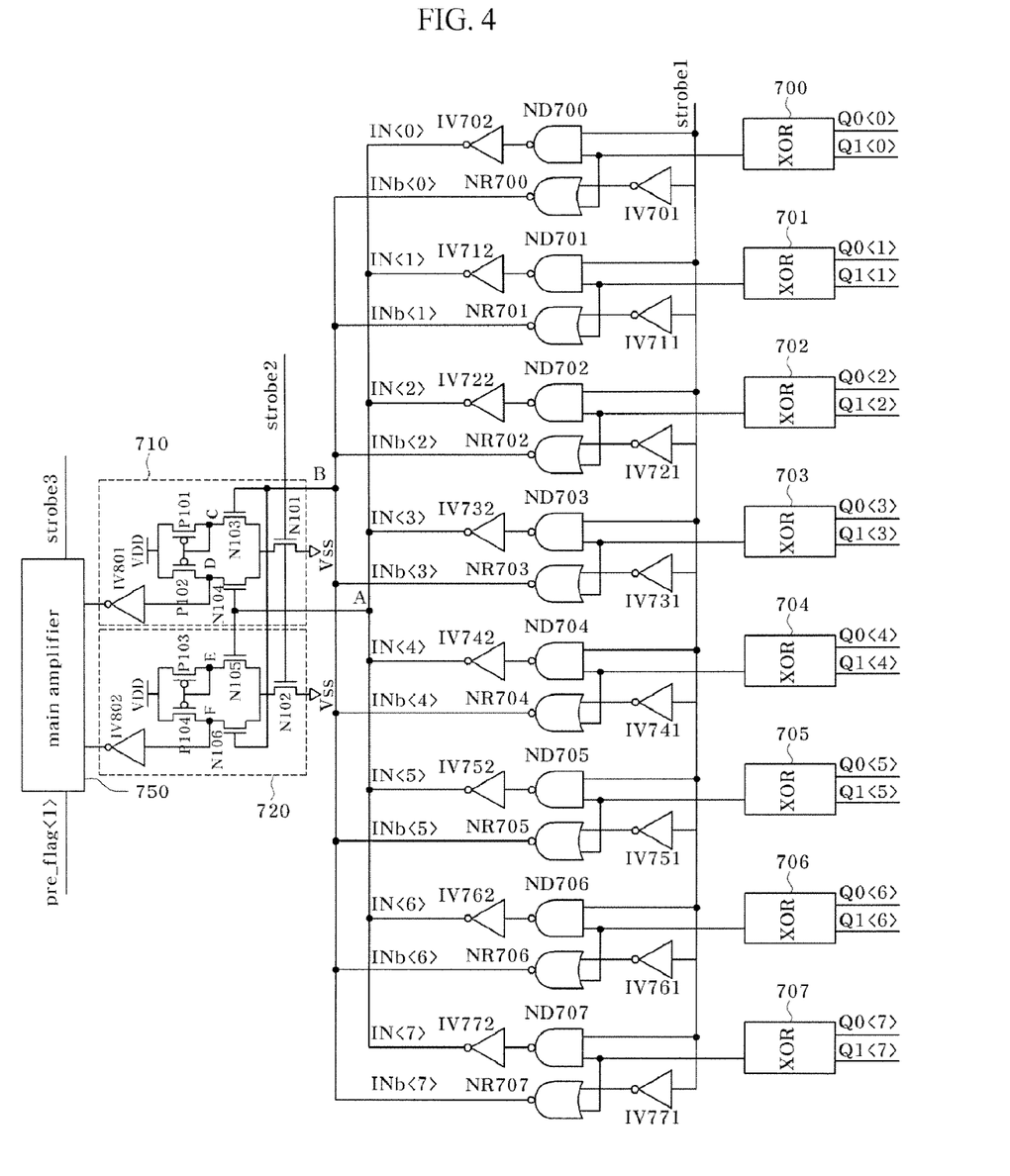
FIG. 4 is a detailed circuit diagram of a comparator in the data output device according to the present invention.
Figure 5:
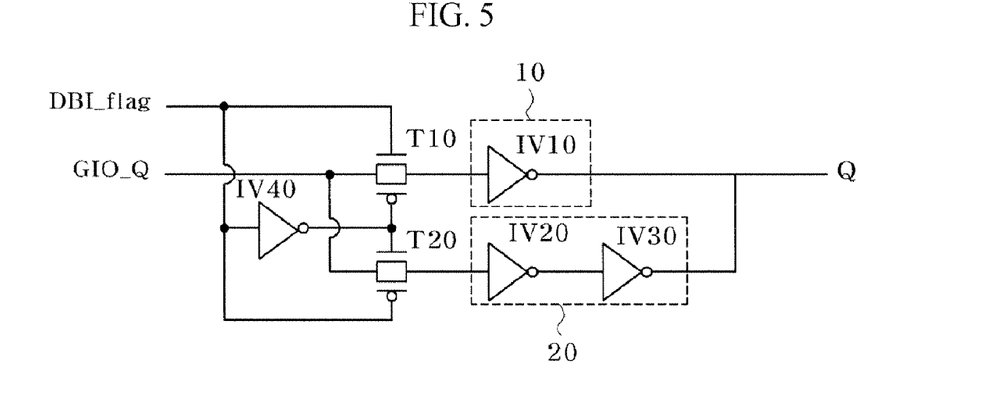
FIG. 5 is a detailed circuit diagram of a sub-output unit in the data output device according to the present invention.
Figure 6:
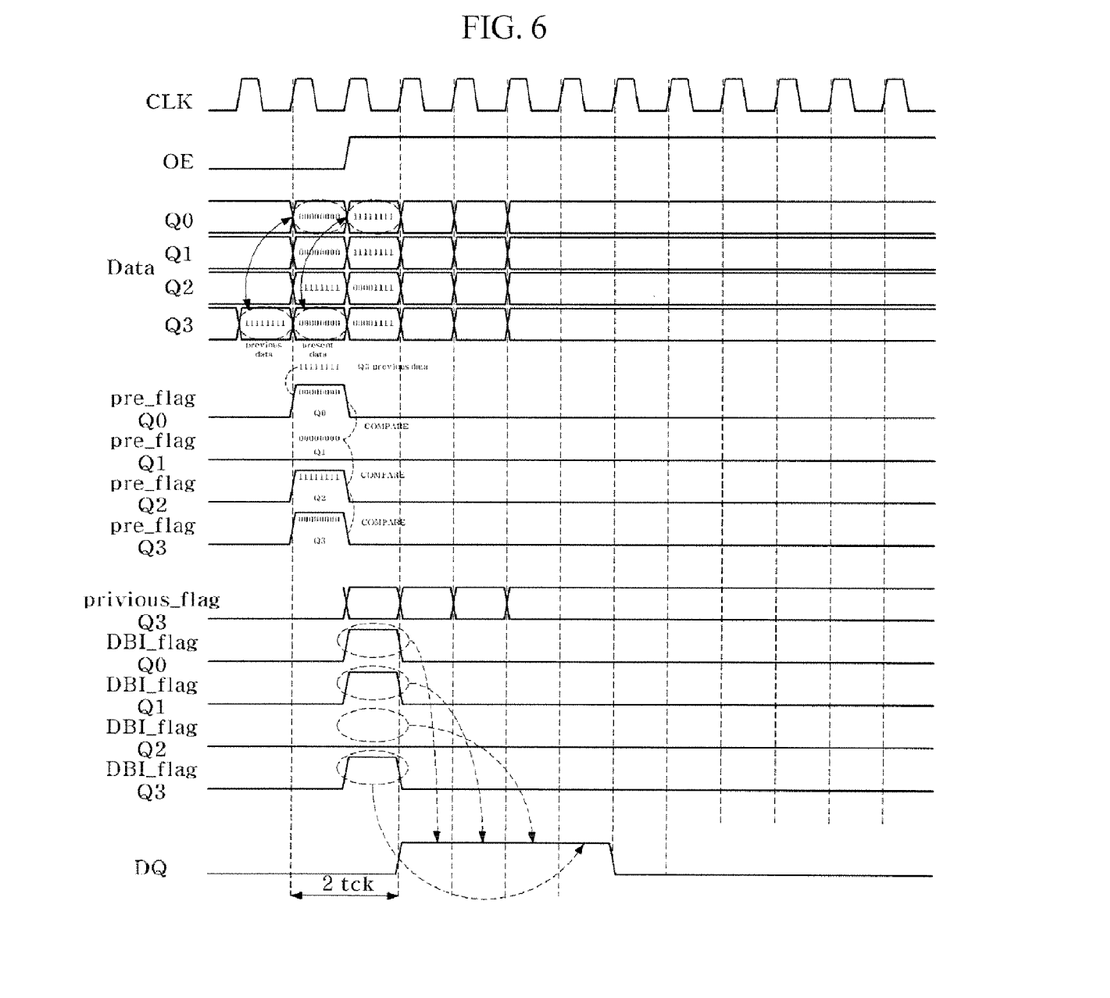
FIG. 6 is a timing diagram of signals in a data output method of a semiconductor device according to the present invention.
Figure 7:
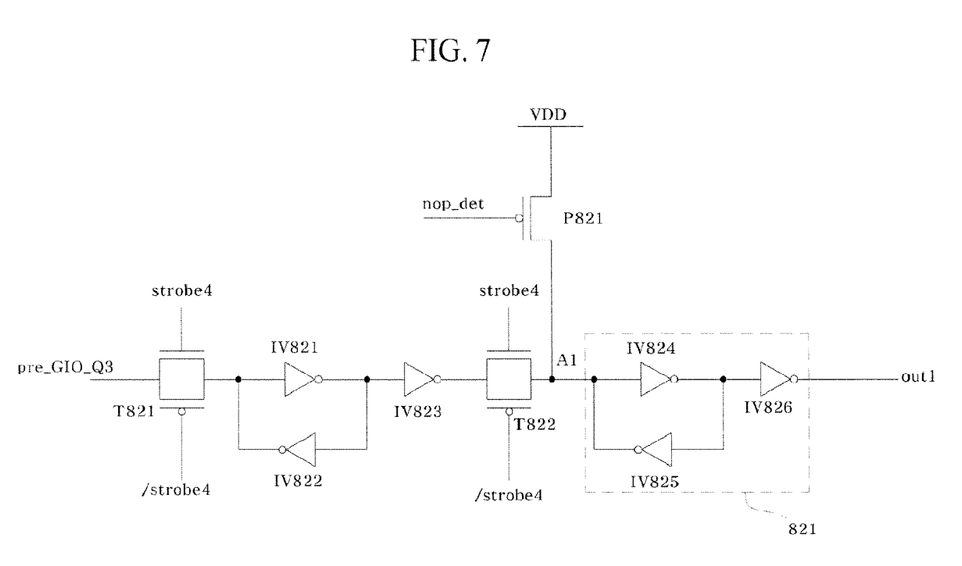
FIG. 7 is a detailed circuit diagram of an output data initializer in the data output device according to the present invention.
Figure 8:
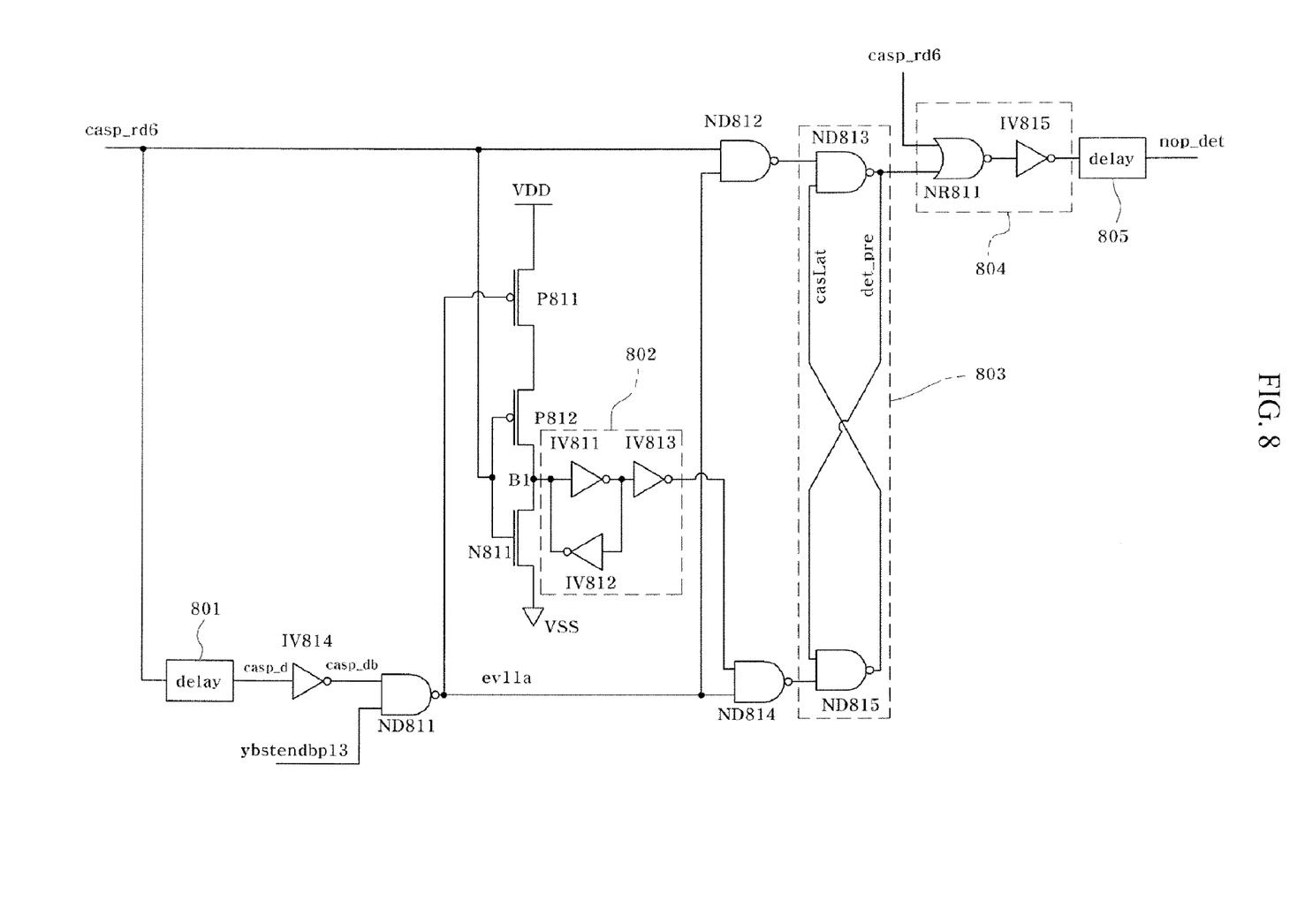
FIG. 8 is a detailed circuit diagram of an initialization signal generator in the data output device according to the present invention.
Figure 9:
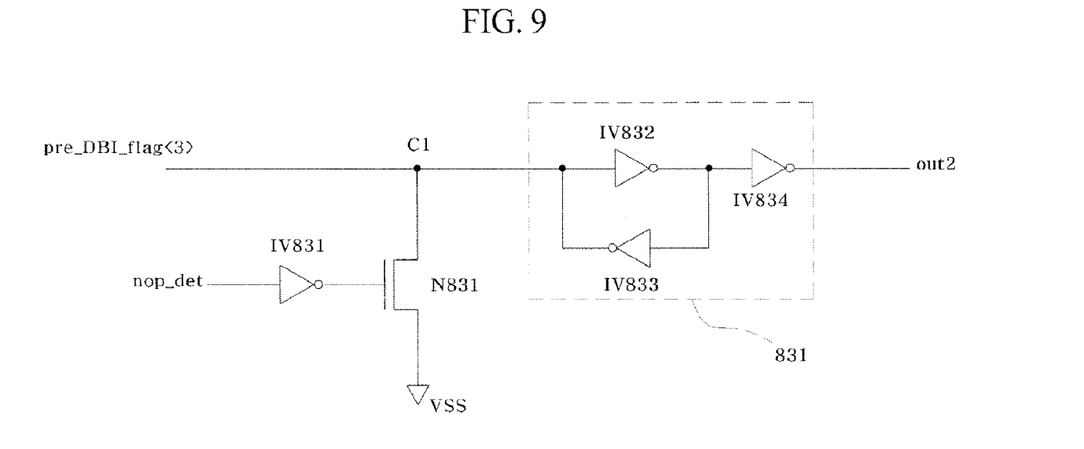
FIG. 9 is a detailed circuit diagram of a flag initializer in the data output device according to the present invention.

FIG. 3 shows the configuration of a data output device of a semiconductor device according to the present invention, FIG. 4 shows the configuration of a comparator in the data output device according to the present invention, FIG. 5 shows the configuration of a sub-output unit in the data output device according to the present invention, FIG. 6 is a timing diagram of signals in a data output method of a semiconductor device according to the present invention, FIG. 7 shows the configuration of an output data initializer in the data output device according to the present invention, FIG. 8 shows the configuration of an initialization signal generator in the data output device according to the present invention, and FIG. 9 shows the configuration of a flag initializer in the data output device according to the present invention. The preferred embodiments of the present invention will hereinafter be described with reference to the figures.

The data output device of the semiconductor device according to the present invention comprises a first comparator 100 for comparing first output data GIO_Q0 with fourth output data pre_GIO_Q3 latched at a previous data processing step on a bit-by-bit basis and outputting a first pre-flag signal pre_flag<0> which is enabled or disabled according to the number of bits of the first output data GIO_Q0 having made level transitions, and a plurality of kth ($2 \leq k \leq 4$, where k is a natural number) comparators, second to fourth comparators 200, 300 and 400, each for comparing kth output data with (k−1)th output data on a bit-by-bit basis and outputting a kth pre-flag signal which is enabled or disabled according to the number of bits of the kth output data having made level transitions. The data output device further comprises a first XOR gate 110 for XORing the first pre-flag signal pre_flag<0> and a fourth data inversion flag signal pre_DBI_flag<3> latched at the previous data processing step and outputting a first data inversion flag signal DBI_flag<0>, and a plurality of kth XOR gates, second to fourth XOR gates 210, 310 and 410, each for XORing a kth pre-flag signal and a (k−1)th data inversion flag signal and outputting a kth data inversion flag signal. The data output device further comprises first to fourth output units 120, 220, 320 and 420 each for inverting or non-inverting and outputting a plurality of bits contained in an associated one of the first to fourth output data GIO_Q0 to GIO_Q3 in response to a corresponding one of the first to fourth data inversion flag signals DBI_flag<0> to DBI_flag<3>, and an output data initializer for, when a no-operation period is generated in a series of data output operations, initializing the fourth output data pre_GIO_Q3 latched at the previous data processing step and supplying the resulting data to the first comparator 100.

The data output device according to the present invention further comprises a flag initializer for, when the no-operation period is generated, initializing the fourth data inversion flag signal pre_DBI_flag<3> latched at the previous data processing step and supplying the resulting signal to the first XOR gate 110.

The operation of the data output device of the semiconductor device with the above-stated configuration according to the present invention will hereinafter be described in detail with reference to FIGS. 3 to 10.

First, as shown in FIG. 3, the first comparator 100 compares first output data GIO_Q0, sent over a global output line, with fourth output data pre_GIO_Q3 latched at a previous data processing step on a bit-by-bit basis. Here, the fourth output data pre_GIO_Q3 latched at the previous data processing step is a latched version of data sent over the global output line at a data processing step preceding the current data processing step. The first comparator 100 outputs a first pre-flag signal pre_flag<0> of a high level if the number of bits of the first output data GIO_Q0 having made high to low level transitions or low to high level transitions exceeds half the total number of bits of the first output data GIO_Q0, and a first pre-flag signal pre_flag<0> of a low level, otherwise.

Similarly, the second comparator 200 compares second output data GIO_Q1, sent over a global output line, with the first output data GIO_Q0 on a bit-by-bit basis. The second comparator 200 then outputs a second pre-flag signal pre_flag<1> of a high level if the number of bits of the second output data GIO_Q1 having made high to low level transitions or low to high level transitions exceeds half the total number of bits of the second output data GIO_Q1, and a second pre-flag signal pre_flag<1> of a low level, otherwise. In the same manner, the third comparator 300 outputs a third pre-flag signal pre_flag<2> and the fourth comparator 400 outputs a fourth pre-flag signal pre_flag<3>.

It should be noted herein that the first to fourth comparators 100, 200, 300 and 400 perform their comparison operations at the same time, resulting in a significant reduction in data processing time as compared with the conventional data output device that sequentially performs the comparison operations.

The operation of each of the first to fourth comparators 100, 200, 300 and 400 will hereinafter be described in more detail with reference to FIG. 4, which shows the configuration of the second comparator 200.

In the case where each of the first output data GIO_Q0 and the second output data GIO_Q1 is 8 bits long, the values of the respective bits are inputted to XOR gates 700 to 707, respectively, as shown in FIG. 4. First, the first bit values Q0<0> and Q1<0> of the first output data GIO_Q0 and second output data GIO_Q1 are inputted to the XOR gate 700. Because the XOR gate 700 performs an exclusive-OR operation, it outputs a high-level signal when only one of the two signals inputted thereto is high in level. In this connection, the XOR gate 700 outputs a high-level signal if a level transition has occurred between Q0<0> and Q1<0>, and a low-level signal, otherwise.

Thereafter, when a strobe signal strobe1 is enabled to be high in level, a logic unit consisting of a NAND gate ND700 and an inverter IV702 performs a logical product operation with respect to the strobe signal strobe1 and the output signal from the XOR gate 700 and outputs the resulting signal IN<0>. A NOR gate NR700 NORs an inverted signal of the strobe signal strobe1 and the output signal from the XOR gate 700 and outputs the resulting signal INb<0>. As a result, when the output signal from the XOR gate 700 becomes high in level due to the occurrence of a level transition between Q0<0> and Q1<0>, the signal IN<0> goes high in level and the signal INb<0> goes low in level. On the contrary, when the output signal from the XOR gate 700 becomes low in level due to the occurrence of no level transition between Q0<0> and Q1<0>, the signal IN<0> goes low in level and the signal INb<0> goes high in level.

In this manner, the signal IN to a node A assumes a high level and the signal INb to a node B assumes a low level, with respect to a bit having made a level transition, and the signal IN to the node A assumes a low level and the signal INb to the node B assumes a high level, with respect to a bit having made no level transition. Thus, provided that the number of bits having made level transitions exceeds half the total number of bits, the number of high-level signals to the node A will be larger than that of high-level signals to the node B, thereby causing the drive capability of an output signal from the node A to be larger than that of an output signal from the node B.

Then, the output signal from the node A is inputted to an NMOS transistor N104 and an NMOS transistor N105 and the output signal from the node B is inputted to an NMOS transistor N103 and an NMOS transistor N106. At this time, if a strobe signal strobe2 is enabled to be high in level, a differential amplifier 710 and a differential amplifier 720 are turned on. First, in the differential amplifier 710, if the number of bits having made level transitions exceeds half the total number of bits, the NMOS transistor N104 is turned on more strongly because the drive capability of the output signal from the node A is larger than that of the output signal from the node B. As a result, the potential of a node D becomes relatively low in level and a signal which is outputted from an inverter IV801 to a main amplifier 750 thus goes high in level. At this time, in the differential amplifier 720, the NMOS transistor N105 is turned on and the current of the NMOS transistor N105 becomes bigger than that of the NMOS transistor N106, thereby causing the potential of a node E to become relatively low in level. As a result, a PMOS transistor P104 is turned on, so that the potential of a node F becomes high in level and an output signal from an inverter IV802 thus goes low in level.

On the other hand, unless the number of bits having made level transitions exceeds half the total number of bits, the drive capability of the output signal from the node A is smaller than that of the output signal from the node B. Accordingly, in the differential amplifier 710, the NMOS transistor N103 is turned on and the current of the NMOS transistor N103 becomes bigger than that of the NMOS transistor N104, so that the potential of a node C becomes relatively low in level and a PMOS transistor P102 is thus turned on, thereby causing the potential of the node D to become high in level. As a result, the signal which is outputted from the inverter IV801 to the main amplifier 750 goes low in level. At this time, in the differential amplifier 720, the NMOS transistor N106 is turned on and the current of the NMOS transistor N106 becomes bigger than that of the NMOS transistor N105, thereby causing the potential of the node F to become relatively low in level. As a result, the output signal from the inverter IV802 assumes a high level.

Next, the main amplifier 750, which is enabled by a strobe signal strobe3, comparison-amplifies the output signals of the different levels from the inverter IV801 and inverter IV802 in response to those two signals to output the second pre-flag signal pre_flag<1>. That is, in the case where the number of bits of the second output data GIO_Q1 having made level transitions exceeds half the total number of bits of the second output data GIO_Q1, the main amplifier 750 receives a high-level signal from the inverter IV801 and a low-level signal from the inverter IV802 and comparison-amplifies the two signals of the different levels to output the second pre-flag signal pre_flag<1> which is high in level. On the contrary, in the case where the number of bits of the second output data GIO_Q1 having made level transitions does not exceed half the total number of bits of the second output data GIO_Q1, the main amplifier 750 receives a low-level signal from the inverter IV801 and a high-level signal from the inverter IV802 and comparison-amplifies the two signals of the different levels to output the second pre-flag signal pre_flag<1> which is low in level.

In this manner, the second comparator 200 compares the second output data GIO_Q1 with the first output data GIO_Q0 on a bit-by-bit basis and outputs the second pre-flag signal pre_flag<1> according to the number of bits of the second output data GIO_Q1 having made level transitions. The first comparator 100, third comparator 300 and fourth comparator 400 are the same in configuration and operation as the second comparator 200, and a more detailed description thereof will thus be omitted.

Next, the first XOR gate 110 XORs the first pre-flag signal pre_flag<0> and a fourth data inversion flag signal pre_DBI_flag<3> latched at the previous data processing step to output a first data inversion flag signal DBI_flag<0>. Here, the fourth data inversion flag signal pre_DBI_flag<3> latched at the previous data processing step is a latched version of a signal outputted from the fourth XOR gate 410 at the data processing step preceding the current data processing step.

The second XOR gate 210 XORs the second pre-flag signal pre_flag<1> and the first data inversion flag signal DBI_flag<0> from the first XOR gate 110 to output a second data inversion flag signal DBI_flag<1>. Similarly, the third XOR gate 310 XORs the third pre-flag signal pre_flag<2> and the second data inversion flag signal DBI_flag<1> to output a third data inversion flag signal DBI_flag<2>, and the fourth XOR gate 410 XORs the fourth pre-flag signal pre_flag<3> and the third data inversion flag signal DBI_flag<2> to output a fourth data inversion flag signal DBI_flag<3>.

Thereafter, the first output unit 120 inverts and outputs a plurality of bits contained in the first output data GIO_Q0 if the first data inversion flag signal DBI_flag<0> is enabled to be high in level, and non-inverts and outputs the plurality of bits contained in the first output data GIO_Q0 if the first data inversion flag signal DBI_flag<0> is disabled to be low in level. In the same manner, the second to fourth output units 220, 320 and 420 invert or non-invert and output the second to fourth output data GIO_Q1 to GIO_Q3 in response to the second to fourth data inversion flag signals DBI_flag<1> to DBI_flag<3>, respectively.

The operation of each of the output units 120, 220, 320 and 420 will hereinafter be described in more detail. Each of the first to fourth output units 120, 220, 320 and 420 includes a plurality of sub-output units, each of which takes charge of any one of the plurality of bits of the associated data. FIG. 5 shows the configuration of each sub-output unit in the data output device according to the present invention.

As shown in FIG. 5, a transfer gate T10 and a transfer gate T20 operate in response to the data inversion flag signal DBI_flag. That is, if the data inversion flag signal DBI_flag is enabled to be high in level, the transfer gate T10 is turned on and the transfer gate T20 is turned off. As a result, the sub-output unit inverts and outputs an associated output data bit GIO_Q by means of the operation of a buffer 10 including an inverter IV10. On the contrary, if the data inversion flag signal DBI_flag is disabled to be low in level, the transfer gate T10 is turned off and the transfer gate T20 is turned on. Thus, the sub-output unit non-inverts and outputs the output data bit GIO_Q by means of the operation of a buffer 20. In this manner, the first to fourth output units 120, 220, 320 and 420 each including the sub-output units invert or non-invert and output the bits contained in the associated output data in response to the associated data inversion flag signals, respectively.

Finally, the first to fourth data inversion flag signals DBI_flag<0> to DBI_flag<3> are inputted to a flag output unit 600, which supplies the inputted data inversion flag signals to a chipset of the semiconductor device. The chipset restores output data from a DQ unit 500 to the original data in response to the supplied data inversion flag signals.

On the other hand, each of the first to fourth XOR gates 110, 210, 310 and 410 is a block that performs an exclusive-OR operation to output a high-level signal when only one of the two signals inputted thereto is high in level. For example, the second XOR gate 210 outputs a high-level data inversion flag signal DBI_flag<1> when only one of the second pre-flag signal pre_flag<1> and the first data inversion flag signal DBI_flag<0> is high in level.

Accordingly, in the case where the first data inversion flag signal DBI_flag<0> and the second pre-flag signal pre_flag<1> are both low in level, no data bit inversion is required between the first output data GIO_Q0 and the second output data GIO_Q1 under the condition that the first output data GIO_Q0 is non-inverted by the output unit 120. In this case, the second XOR gate 210 outputs a low-level signal so that the bits of the second output data GIO_Q1 can be non-inverted.

In the case where the first data inversion flag signal DBI_flag<0> is low in level and the second pre-flag signal pre_flag<1> is high in level, a data bit inversion is required between the first output data GIO_Q0 and the second output data GIO_Q1 under the condition that the first output data GIO_Q0 is non-inverted by the output unit 120. In this case, the second XOR gate 210 outputs a high-level signal so that the bits of the second output data GIO_Q1 can be inverted.

In the case where the first data inversion flag signal DBI_flag<0> is high in level and the second pre-flag signal pre_flag<1> is low in level, no data bit inversion is required between the first output data GIO_Q0 and the second output data GIO_Q1 under the condition that the first output data GIO_Q0 is inverted by the output unit 120. In conclusion, the second output data GIO_Q1 also needs to be inverted. In this case, the second XOR gate 210 outputs the high-level signal so that the bits of the second output data GIO_Q1 can be inverted.

Finally, in the case where the first data inversion flag signal DBI_flag<0> and the second pre-flag signal pre_flag<1> are both high in level, a data bit inversion is required between the first output data GIO_Q0 and the second output data GIO_Q1 under the condition that the first output data GIO_Q0 is inverted by the output unit 120. In conclusion, the second output data GIO_Q1 need not be inverted. In this case, the second XOR gate 210 outputs the low-level signal so that the bits of the second output data GIO_Q1 can be non-inverted.

As described above, according to the present invention, differently from the conventional data output device, there is no need to determine whether to invert output data and sequentially compare the output data with the next output data. That is, according to the present invention, the comparisons between output data sent over associated global output lines are made at the same time, thereby making it possible to sufficiently secure an address access time margin and accurately and stably process high-speed data in a high-frequency operation. FIG. 6 is a timing diagram of the signals in the data output method of the semiconductor device according to the present invention. As can be seen from FIG. 6, an address access time can be sufficiently secured according to the present invention, as compared with the conventional one.

The data output device of the semiconductor device according to the present invention further comprises a plurality of means that enable the normal output of data even when a no-operation period is generated in a series of data output operations.

In the data output method of the present invention, as described above, the first comparator 100 performs its comparison operation using the fourth output data pre_GIO_Q3 latched at the previous data processing step, and the first XOR gate 110 performs its exclusive-OR operation using the fourth data inversion flag signal pre_DBI_flag<3> latched at the previous data processing step.

Figure 10:
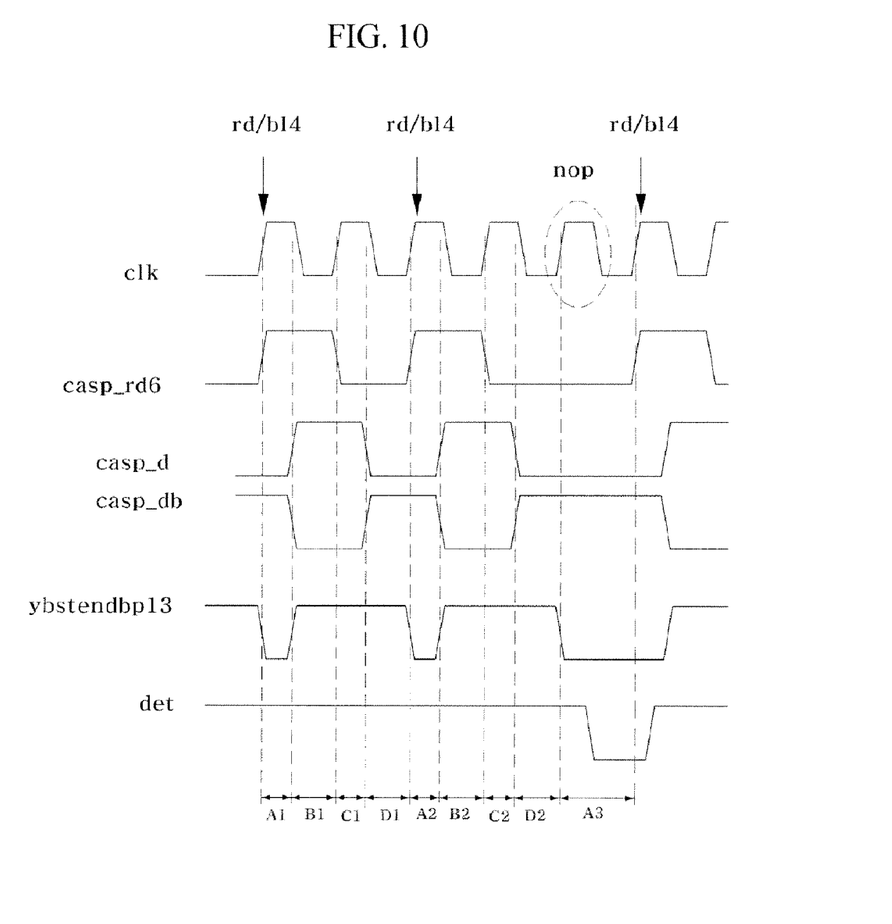
FIG. 10 is a timing diagram illustrating generation of an initialization signal in the data output device according to the present invention.

Note that a data output error may occur when a no-operation period is generated in a series of data output operations. The no-operation period signifies an irregular interval in which no data output operation is performed while a series of data output operations are regularly performed in response to a read command. For example, as shown in FIG. 10, when a burst length is 4, a read operation, etc., are performed regularly at intervals of 2 clocks in the normal state. At this time, an irregular interval in which any operation is not performed in the middle of data output may sometimes be generated, which is called a no-operation period. This no-operation period may last for several clocks to several tens of clocks in some cases. The longer the no-operation period, the higher the possibility that information of the fourth output data pre_GIO_Q3 and fourth data inversion flag signal pre_DBI_flag<3> at the previous data processing step will be lost. In this case, when the next read command is inputted, the first comparator 100 or the first XOR gate 110 may not normally perform its comparison operation or exclusive-OR operation, resulting in the occurrence of a data output error.

In order to solve this problem, the data output device according to the present invention is adapted to, when a no-operation period is generated in a series of data output operations, initialize the fourth output data pre_GIO_Q3 latched at the previous data processing step and supply the resulting data to the first comparator 100, and to initialize the fourth data inversion flag signal pre_DBI_flag<3> latched at the previous data processing step and supply the resulting signal to the first XOR gate 110. Therefore, it is possible to normally output data even though the no-operation period is generated. These solutions will hereinafter be described in more detail.

FIG. 7 shows the configuration of the output data initializer in the data output device according to the present invention. As shown in this drawing, the fourth output data pre_GIO_Q3 at the previous data processing step is inputted to a transfer gate T821 of the output data initializer. If a strobe signal strobe4 for timing control is enabled, the transfer gate T821 transfers the fourth output data pre_GIO_Q3, a latch circuit, which is composed of an inverter IV821, an inverter IV822 and an inverter IV823, latches the fourth output data pre_GIO_Q3 transferred by the transfer gate T821, and a transfer gate T822 transfers the fourth output data pre_GIO_Q3 latched by the latch circuit to a node A1. Then, a latch circuit 821 latches and outputs information of the node A1. As a result, in the normal data output operation, the output data initializer outputs the fourth output data pre_GIO_Q3 at the previous data processing step. However, if a no-operation period is generated at this time, a PMOS transistor P821 is turned on in response to an initialization signal nop_det, which is enabled to be low in level for a predetermined period when the no-operation period is generated. Accordingly, the PMOS transistor P821 pulls the node A1 up to a high level, so as to initialize the fourth output data pre_GIO_Q3 transferred to the node A1 to the high level. Then, the first comparator 100 performs its comparison operation using the initialized data.

In brief, the output data initializer supplies the fourth output data pre_GIO_Q3 at the previous data processing step to the first comparator 100 in the normal data output operation, and initializes the fourth output data pre_GIO_Q3 and supplies the resulting data to the first comparator 100, if a no-operation period is generated.

Next, the configuration and operation of an initialization signal generator which generates the initialization signal will be described with reference to FIG. 8.

First, if a control signal casp_rd6 is inputted, a delay 801 and an inverter IV814 cooperate to delay and inversion-buffer the inputted control signal casp_rd6 and supply the resulting signal casp_db to a NAND gate ND811. Then, the NAND gate ND811 NANDs the signal casp_db and a control signal ybstendbp13 and outputs the resulting signal ev11a. Here, the control signal casp_rd6 is generated by a command decoder and is enabled upon input of a read command to inform each logic that the read command has been inputted. The control signal ybstendbp13 makes a level transition when a unit burst operation is completed, and acts to represent a burst length. This control signal ybstendbp13 is enabled for a burst operation period, and makes a high to low level transition when the unit burst operation is completed and then a low to high level transition when the control signal casp_rd6 is enabled to be high in level.

Thereafter, a PMOS transistor P811 and a PMOS transistor P812 cooperate to pull a node B1 up, respectively, in response to the signal ev11a and the control signal casp_rd6, and an NMOS transistor N811 pulls the node B1 down in response to the control signal casp_rd6. Then, a latch circuit 802, which is composed of an inverter IV811, an inverter IV812 and an inverter IV813, latches/buffers and outputs an output signal from the node B1. A NAND gate ND814 receives and NANDs the signal ev11a and the output signal from the latch circuit 802, and a NAND gate ND812 receives and NANDs the control signal casp_rd6 and the signal ev11a.

A NAND gate ND813, which constitutes a latch circuit 803 with a NAND gate ND815, receives and NANDs an output signal from the NAND gate ND812 and a signal casLat, and the NAND gate ND815 receives and NANDs an output signal from the NAND gate ND814 and a signal det_pre. Then, a logic unit 804, which is composed of a NOR gate NR811 and an inverter IV815, receives the control signal casp_rd6 and the signal det_pre and performs a logical sum operation with respect to the received signals, and a delay 805 delays an output signal from the logic unit 804 for a predetermined period and outputs the delayed signal as the initialization signal nop_det.

In this manner, the initialization signal generator generates the initialization signal nop_det in response to the control signal casp_rd6 and the control signal ybstendbp13, which will hereinafter be described in more detail.

First, if the control signal casp_rd6 is enabled to be high in level owing to the input of the read command, the NOR gate NR811 receives the high-level signal at one input terminal thereof, thereby causing the initialization signal nop_det from the delay 805 to become high in level.

In a period A1 in FIG. 10, the control signal casp_rd6 and the signal casp_db become high in level and the control signal ybstendbp13 becomes low in level. As a result, the signal ev11a assumes a high level, and the NAND gate ND812 receives the high-level signals at both input terminals thereof and outputs a low-level signal. Then, the NAND gate ND813 receives the low-level signal from the NAND gate ND812 and outputs a high-level signal det_pre. Thus, the logic unit 804 outputs a high-level signal, so that the initialization signal nop_det from the delay 805 becomes high in level. At this time, the NMOS transistor N811 pulls the node B1 down to a low level in response to the high-level control signal casp_rd6, and the latch circuit 802 latches an output signal from the node B1 and outputs the resulting low-level signal to the NAND gate ND814. The NAND gate ND814 outputs a high-level signal in response to the low-level signal from the latch circuit 802. Then, the NAND gate ND815 receives the high-level signal det_pre and the high-level signal from the NAND gate ND814 and outputs a low-level signal casLat.

Next, in a period B1 in FIG. 10, the control signal casp_rd6 assumes a high level, the signal casp_db assumes a low level, and the control signal ybstendbp13 assumes a high level. As a result, the signal ev11a becomes high in level. Accordingly, in the period B1, the same state as in the period A1 is maintained and the initialization signal nop_det remains high in level.

In a period C1 in FIG. 10, the control signal casp_rd6 assumes a low level, the signal casp_db assumes a low level, and the control signal ybstendbp13 assumes a high level. As a result, the signal ev11 a becomes high in level, and the NAND gate ND812 receives the high-level signal and the low-level signal and outputs a high-level signal. At this time, the NMOS transistor N811 and the PMOS transistor P811 are turned off, but the output signal from the IV813 is maintained in the previous low level state by the operation of the latch circuit 802. Thus, the NAND gate ND814 outputs a high-level signal in response to the low-level signal from the latch circuit 802. Then, the NAND gate ND815 receives the previous high-level signal det_pre and the high-level signal from the NAND gate ND814 and continuously outputs the low-level signal casLat, and the NAND gate ND813 continuously outputs the high-level signal. Consequently, even in the period C1, the initialization signal nop_det remains high in level.

In a period D1 in FIG. 10, the control signal casp_rd6 becomes low in level, and the signal casp_db and the control signal ybstendbp13 become high in level. As a result, the signal ev11a assumes a low level, and the NAND gate ND812 receives the low-level signals at both input terminals thereof and outputs a high-level signal. At this time, because the PMOS transistor P812 and the PMOS transistor P811 are turned on, respectively, in response to the control signal casp_rd6 and the signal ev11a, the node B1 is pulled up to a high level, and the latch circuit 802 latches the high-level signal from the node B1 and outputs it to the NAND gate ND814. As a result, the NAND gate ND814 receives the low-level signal ev11a and outputs a high-level signal. Then, the NAND gate ND815 receives the previous high-level signal det_pre and the high-level signal from the NAND gate ND814 and continuously outputs the low-level signal casLat, and the NAND gate ND813 continuously outputs the high-level signal. Consequently, even in the period D1, the initialization signal nop_det remains high in level.

Next, in a period A2 in which the read command is again inputted, the initialization signal nop_det remains high in level similarly to in the period A1.

Therefore, in the case where the read command is regularly inputted, namely, a series of data output operations are continuously performed without a no-operation period, the initialization signal nop_det is continuously maintained in the disabled state of the high level, so that the output data initializer supplies the fourth output data pre_GIO_Q3 at the previous data processing step directly to the first comparator 100, without initializing it.

On the other hand, when a no-operation period is generated as in a period A3, the control signal casp_rd6 assumes a low level, the signal casp_db assumes a high level, and the control signal ybstendbp13 assumes a low level. As a result, the signal ev11a becomes high in level, and the NAND gate ND812 receives the low-level signal and the high-level signal and outputs a high-level signal. At this time, the NMOS transistor N811 and the PMOS transistor P811 are turned off, but the output signal from the IV813 is maintained in the previous high level state by the operation of the latch circuit 802. Thus, the NAND gate ND814 receives the high-level signals at both input terminals thereof and outputs a low-level signal. Then, the NAND gate ND815 outputs a high-level signal casLat, and the NAND gate ND813 receives the high-level signals at both input terminals thereof and outputs a low-level signal. Then, the logic unit 804 performs a logical sum operation with respect to the low-level control signal casp_rd6 and the low-level signal det_pre and outputs the resulting low-level signal. As a result, the initialization signal nop_det from the delay 805 is enabled to be low in level for a predetermined period.

Therefore, when a no-operation period is generated in a series of data output operations, the initialization signal nop_det from the delay 805 is enabled to be low in level, so that the output data initializer initializes the fourth output data pre_GIO_Q3 at the previous data processing step and supplies the resulting data to the first comparator 100.

FIG. 9 shows the configuration of the flag initializer in the data output device according to the present invention. As shown in this drawing, the fourth data inversion flag signal pre_DBI_flag<3> at the previous data processing step is applied to a node C1 of the flag initializer. A latch circuit 831, which is composed of an inverter IV832, an inverter IV833 and an inverter IV834, latches and outputs information of the node C1. Accordingly, in the normal data output operation, the flag initializer outputs the fourth data inversion flag signal pre_DBI_flag<3> at the previous data processing step as it is. However, if a no-operation period is generated at this time, an NMOS transistor N831 is turned on in response to an inverted signal of the initialization signal nop_det. As a result, the NMOS transistor N831 pulls the node C1 down to a low level, so as to initialize the fourth data inversion flag signal pre_DBI_flag<3> transferred to the node C1 to a high level. Then, the first XOR gate 110 performs an exclusive-OR operation using the initialized signal.

In brief, the flag initializer directly supplies the fourth data inversion flag signal pre_DBI_flag<3> at the previous data processing step to the first XOR gate 110 in the normal data output operation, and initializes the fourth data inversion flag signal pre_DBI_flag<3> and supplies the resulting signal to the first XOR gate 110 if a no-operation period is generated. At this time, the flag initializer uses the initialization signal nop_det generated by the initialization signal generator.

As described above, the data output device and method of the semiconductor device according to the present invention can reduce power noise in an output driver resulting from a data transition when data is outputted from the semiconductor device, can accurately and stably process high-speed data in a high-frequency operation of the semiconductor device, and can normally output data through the signal and data initialization even though a no-operation period is generated in a series of data output operations.

Although the preferred embodiments of the present invention have been disclosed as being based on a 4-bit pre-fetch mode for illustrative purposes, the present invention is not limited thereto.

As apparent from the above description, the present invention provides a data output device and method of a semiconductor device which can reduce power noise in an output driver resulting from a data transition when data is outputted from the semiconductor device, can accurately and stably process high-speed data in a high-frequency operation of the semiconductor device, and can normally output data even though a no-operation period is generated in a series of data output operations.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed as new and desired to be protected by Letters Patent of the United States is:

1. A data output device of a semiconductor device, comprising:
   a first comparator for comparing first output data with arbitrary output data latched at a previous data processing step on a bit-by-bit basis and outputting a first pre-flag signal which is enabled or disabled according to the number of bits of the first output data having made level transitions;
   a second comparator for comparing second output data with the first output data on a bit-by-bit basis and outputting a second pre-flag signal which is enabled or disabled according to the number of bits of the second output data having made level transitions;
   a first logic unit for performing a logic operation with respect to the first pre-flag signal and an arbitrary data inversion flag signal latched at the previous data processing step and outputting a first data inversion flag signal;
   a second logic unit for performing a logic operation with respect to the second pre-flag signal and the first data inversion flag signal and outputting a second data inversion flag signal;
   a first output unit for inverting or non-inverting and outputting a plurality of bits contained in the first output data in response to the first data inversion flag signal;
   a second output unit for inverting or non-inverting and outputting a plurality of bits contained in the second output data in response to the second data inversion flag signal; and
   an output data initializer for, when a no-operation period is generated in a series of data output operations, initializing the arbitrary output data and supplying the resulting data to the first comparator.

2. The data output device as set forth in claim 1, wherein the output data initializer includes:
   transfer means for transferring the arbitrary output data to a first node; and
   a driver for driving and initializing the first node to a predetermined level in response to an initialization signal which is enabled for a predetermined period when the no-operation period is generated.

3. The data output device as set forth in claim 2, wherein the driver includes pull-up means for pulling the first node up in response to the initialization signal.

4. The data output device as set forth in claim 2, wherein the output data initializer further includes latch means for latching an output signal from the first node.

5. The data output device as set forth in any one of claim 2, further comprising an initialization signal generator for generating the initialization signal, the initialization signal generator including:
   a first buffer for buffering a first control signal which is enabled for a predetermined period upon input of a read command;
   first logic means for performing a logic operation with respect to an output signal from the first buffer and a second control signal which is enabled for a burst operation period;
   a second buffer including pull-up means for pulling a second node up in response to an output signal from the first logic means and the first control signal, and pull-down means for pulling the second node down in response to the first control signal;
   second logic means for performing a logic operation with respect to the output signal from the first logic means and an output signal from the second buffer;
   third logic means for performing a logic operation with respect to the first control signal and the output signal from the first logic means;
   a latch circuit including a first logic element and a second logic element interconnected in latch form, the first logic element receiving an output signal from the third logic means at one input terminal thereof, the second logic element receiving an output signal from the second logic means at one input terminal thereof; and fourth logic means for performing a logic operation with respect to the first control signal and an output signal from the latch circuit.

6. The data output device as set forth in claim 5, wherein the first buffer is an inversion-delay buffer.

7. The data output device as set forth in claim 5, wherein each of the first to third logic means is adapted to perform a NAND operation.

8. The data output device as set forth in claim 5, wherein each of the first and second logic elements is adapted to perform a NAND operation.

9. The data output device as set forth in claim 5, wherein the fourth logic means is adapted to perform a logical sum operation.

10. The data output device as set forth in claim 1, further comprising a flag initializer for, when the no-operation period is generated, initializing the arbitrary data inversion flag signal and supplying the resulting signal to the first logic unit.

11. The data output device as set forth in claim 10, wherein the flag initializer includes:
a driver for driving and initializing a first node, to which the arbitrary data inversion flag signal has been transferred, to a predetermined level in response to an initialization signal which is enabled for a predetermined period when the no-operation period is generated; and
latch means for latching an output signal from the first node.

12. The data output device as set forth in claim 11, wherein the driver includes pull-down means for pulling the first node down in response to the initialization signal.

13. The data output device as set forth in claim 11, further comprising an initialization signal generator for generating the initialization signal, the initialization signal generator including:
a first buffer for buffering a first control signal which is enabled for a predetermined period upon input of a read command;
first logic means for performing a logic operation with respect to an output signal from the first buffer and a second control signal which is enabled for a burst operation period;
a second buffer including pull-up means for pulling a second node up in response to an output signal from the first logic means and the first control signal, and pull-down means for pulling the second node down in response to the first control signal;
second logic means for performing a logic operation with respect to the output signal from the first logic means and an output signal from the second buffer;
third logic means for performing a logic operation with respect to the first control signal and the output signal from the first logic means;
a latch circuit including a first logic element and a second logic element interconnected in latch form, the first logic element receiving an output signal from the third logic means at one input terminal thereof, the second logic element receiving an output signal from the second logic means at one input terminal thereof; and
fourth logic means for performing a logic operation with respect to the first control signal and an output signal from the latch circuit.

14. The data output device as set forth in claim 13, wherein the first buffer is an inversion-delay buffer.

15. The data output device as set forth in claim 13, wherein each of the first to third logic means is adapted to perform a NAND operation.

16. The data output device as set forth in claim 13, wherein each of the first and second logic elements is adapted to perform a NAND operation.

17. The data output device as set forth in claim 13, wherein the fourth logic means is adapted to perform a logical sum operation.

18. The data output device as set forth in claim 1, wherein the first and second comparators are adapted to perform their comparison operations at the same time.

19. The data output device as set forth in claim 1, wherein each of the first and second comparators is adapted to enable a corresponding one of the first and second pre-flag signals if the number of the bits of an associated one of the first and second output data having made the level transitions exceeds half of a total number of the bits of the associated output data.

20. The data output device as set forth in claim 19, wherein each of the first and second comparators is adapted to compare two output data with each other on a bit-by-bit basis, the two output data being the first output data and arbitrary output data, or the first output data and second output data, each of the first and second comparators including:
a plurality of logic elements, each of the logic elements performing a logic operation with respect to two associated bits of the same order contained respectively in the two output data;
a plurality of signal supply circuits, each of the signal supply circuits performing a logic operation with respect to a strobe signal and an output signal from an associated one of the logic elements and supplying the resulting signals to a first node and a second node, respectively;
a first differential amplifier for comparison-amplifying an output signal from the first node and an output signal from the second node;
a second differential amplifier for comparison-amplifying the output signal from the first node and the output signal from the second node; and
a main amplifier for comparison-amplifying an output signal from the first differential amplifier and an output signal from the second differential amplifier and outputting the resulting signal as the corresponding pre-flag signal.

21. The data output device as set forth in claim 20, wherein each of the logic elements is adapted to perform an exclusive-OR operation.

22. The data output device as set forth in claim 21, wherein each of the signal supply circuits includes:
first logic means for performing a logical product operation with respect to the strobe signal and the output signal from the associated logic element and supplying the resulting signal to the first node; and
second logic means for performing a NOR operation with respect to an inverted signal of the strobe signal and the output signal from the associated logic element and supplying the resulting signal to the second node.

23. The data output device as set forth in claim 1, wherein each of the first and second logic units is adapted to perform an exclusive-OR operation.

24. The data output device as set forth in claim 1, wherein each of the first and second output data is sent over an associated global output line.

25. The data output device as set forth in claim 1, wherein the arbitrary output data latched at the previous data processing step is last output data at the previous data processing step.

26. The data output device as set forth in claim 1, wherein the arbitrary data inversion flag signal latched at the previous data processing step is a last data inversion flag signal at the previous data processing step.

27. A data output method of a semiconductor device, comprising the steps of:
   (a) comparing first output data with arbitrary output data latched at a previous data processing step on a bit-by-bit basis and outputting a first pre-flag signal which is enabled or disabled according to the number of bits of the first output data having made level transitions, and simultaneously comparing second output data with the first output data on a bit-by-bit basis and outputting a second pre-flag signal which is enabled or disabled according to the number of bits of the second output data having made level transitions;
   (b) performing a logic operation with respect to the first pre-flag signal and an arbitrary data inversion flag signal latched at the previous data processing step and outputting a first data inversion flag signal, and performing a logic operation with respect to the second pre-flag signal and the first data inversion flag signal and outputting a second data inversion flag signal; and
   (c) inverting or non-inverting and outputting a plurality of bits contained in the first or second output data in response to the first or second data inversion flag signal, wherein the step (a) includes the step of, when a no-operation period is generated in a series of data output operations, initializing the arbitrary output data and comparing the first output data with the resulting data.

28. The data output method as set forth in claim 27, wherein the step (b) includes the step of, when the no-operation period is generated, initializing the arbitrary data inversion flag signal and performing a logic operation with respect to the first pre-flag signal and the resulting signal.

29. The data output method as set forth in claim 27, wherein the step (a) further includes the step of enabling the first or second pre-flag signal if the number of the bits of the first or second output data having made the level transitions exceeds half of a total number of the bits of the first or second output data.

30. The data output method as set forth in claim 27, wherein each of the logic operations at the step (b) is an exclusive-OR operation.

31. The data output method as set forth in claim 27, wherein each of the first and second output data is sent over an associated global output line.

32. The data output method as set forth in claim 27, wherein the arbitrary output data latched at the previous data processing step is last output data at the previous data processing step.

33. The data output method as set forth in claim 27, wherein the arbitrary data inversion flag signal latched at the previous data processing step is a last data inversion flag signal at the previous data processing step.

* * * * *

UNITED STATES PATENT AND TRADEMARK OFFICE
CERTIFICATE OF CORRECTION

| | | |
|---|---|---|
| PATENT NO. | : 7,228,370 B2 | Page 1 of 1 |
| APPLICATION NO. | : 11/162168 | |
| DATED | : June 5, 2007 | |
| INVENTOR(S) | : Seung W. Kwack et al. | |

It is certified that error appears in the above-identified patent and that said Letters Patent is hereby corrected as shown below:

<u>On the Title Page:</u>

Item (75), 1st named Inventor, "Seung Kwack" should be -- Seung Wook Kwack --.

Item (75), 2nd named Inventor, "Ki Kwean" should be -- Ki Chang Kwean --.

Signed and Sealed this

Fourth Day of December, 2007

JON W. DUDAS
*Director of the United States Patent and Trademark Office*